US012640684B1

(12) United States Patent
Chen et al.

(10) Patent No.: US 12,640,684 B1
(45) Date of Patent: May 26, 2026

(54) OSCILLATING DEVICE

(71) Applicant: TXC CORPORATION, Taipei (TW)

(72) Inventors: Yu-Liang Chen, Tao Yuan City (TW); Chih-Hsun Chen, Tao Yuan City (TW); Chi-Lun Yu, Tao Yuan City (TW); Sheng-Hsiang Kao, Tao Yuan City (TW)

(73) Assignee: TXC CORPORATION, Taipei (TW)

( * ) Notice: Subject to any disclaimer, the term of this patent is extended or adjusted under 35 U.S.C. 154(b) by 0 days.

(21) Appl. No.: 18/959,127

(22) Filed: Nov. 25, 2024

(51) Int. Cl.
  _H03B 5/32_     (2006.01)
  _H03B 5/04_     (2006.01)
(52) U.S. Cl.
  CPC ................. _H03B 5/32_ (2013.01); _H03B 5/04_ (2013.01); _H03B 2200/009_ (2013.01); _H03B 2202/05_ (2013.01)
(58) Field of Classification Search
  CPC ....................................................... H03B 5/32
  USPC ........................................................ 331/158
  See application file for complete search history.

(56) References Cited

U.S. PATENT DOCUMENTS

| | | | |
|---|---|---|---|
| 6,741,137 B1 * | 5/2004 | Sibrai | H03B 5/36 |
| | | | 331/109 |
| 6,963,248 B2 | 11/2005 | Ward et al. | |
| 8,446,222 B2 | 5/2013 | Brenndorfer | |
| 9,837,958 B2 | 12/2017 | Chen et al. | |
| 11,469,738 B1 * | 10/2022 | Hsieh | H03B 5/04 |
| 2006/0132248 A1 | 6/2006 | Lichter et al. | |
| 2023/0018805 A1 * | 1/2023 | Chen | H03B 5/32 |
| 2024/0195377 A1 | 6/2024 | Reinhardt et al. | |

FOREIGN PATENT DOCUMENTS

| | | |
|---|---|---|
| JP | 6872387 B2 | 5/2021 |
| TW | I762734 B | 5/2022 |
| TW | I776901 B | 9/2022 |
| WO | WO 2018/065925 A1 | 4/2018 |

* cited by examiner

_Primary Examiner_ — Joseph Chang
(74) _Attorney, Agent, or Firm_ — Birch, Stewart, Kolasch & Birch, LLP

(57)                ABSTRACT

An oscillating device includes a first quartz crystal resonator, a driving circuit, a first buffer, a bandpass filter, a second quartz crystal resonator, and a second buffer coupled to each other. The driving circuit drives the first quartz crystal resonator to generate a first oscillating signal with a resonant frequency. The first buffer isolates from a load variation to generate a first clock signal in response to the first oscillating signal. The bandpass filter allows only the first clock signal with the harmonic frequency of the resonant frequency within a passband to pass through, thereby generating a filtered signal. The second quartz crystal resonator rectifies the filtered signal to generate a second oscillating signal having the harmonic frequency. The second buffer isolates from a load variation to generate a second clock signal in response to the second oscillating signal.

9 Claims, 9 Drawing Sheets

1

OSCILLATING DEVICE

BACKGROUND OF THE INVENTION

Field of the Invention

The present invention relates to an oscillating device, particularly to an oscillating device for generating high harmonic frequency with reduced phase noise.

Description of the Related Art

Currently, Crystal Oscillators (XO), Temperature Compensated Crystal Oscillators (TCXO), Voltage Controlled Crystal Oscillators (VCXO), Voltage Controlled Temperature Compensated Crystal Oscillators (VCTCXO), and Oven Controlled Crystal Oscillators (OCXO) that are characterized by small size (i.e., having a footprint of about 14 mm×9 mm or smaller), low power consumption, high performance, and low cost are readily available for frequencies up to about 52 MHz.

Several performance issues associated with crystal resonators and oscillator circuits have prevented such oscillators from becoming available for frequencies beyond that. The performance issues include higher phase noise and higher power consumption. Specifically, the phase noise increases as the frequency increases. Because when the frequency rises, the oscillator's phase deviation (caused by noise) has a more noticeable impact on the signal. High-frequency oscillators often require a higher gain-bandwidth product to achieve stable oscillation, which typically results in higher power consumption and higher phase noise. Additionally, the noise generated by noise sources in physical materials, manufacturing processes, and circuit design become more pronounced at higher frequencies. The high-frequency response of oscillator components (such as crystals, inductors, capacitors, etc.) may enhance instability, thereby leading to more phase noise.

To overcome the abovementioned problems, the present invention provides an oscillating device, so as to solve the afore-mentioned problems of the prior art.

SUMMARY OF THE INVENTION

The present invention provides an oscillating device, which generates high harmonic frequency with reduced phase noise.

In an embodiment of the present invention, an oscillating device includes a first quartz crystal resonator, a driving circuit, a first buffer, a bandpass filter, a second quartz crystal resonator, and a second buffer. The first quartz crystal resonator has a resonant frequency. The driving circuit is coupled to the first quartz crystal resonator and configured to drive the first quartz crystal resonator to generate a first oscillating signal with the resonant frequency. The first buffer is coupled to the driving circuit and configured to receive the first oscillating signal and isolate from a load variation behind the first quartz crystal resonator and the driving circuit to generate a first clock signal in response to the first oscillating signal. The bandpass filter, coupled to the first buffer, has a passband. The bandpass filter is configured to receive and allow only the first clock signal with the harmonic frequency of the resonant frequency within the passband to pass through, thereby generating a filtered signal. The second quartz crystal resonator, having a frequency equal to the harmonic frequency, is coupled to the bandpass filter and configured to receive and rectify the filtered signal to generate a second oscillating signal having the harmonic frequency. The second buffer is coupled to the second quartz crystal resonator and configured to receive the second oscillating signal and isolate from a load variation behind the first quartz crystal resonator, the driving circuit, the first buffer, the bandpass filter, and the second quartz crystal resonator to generate a second clock signal in response to the second oscillating signal.

In an embodiment of the present invention, the oscillating device further includes a waveform adjustment circuit coupled between the bandpass filter and the second quartz crystal resonator and configured to adjust the waveform swing, the direct-current (DC) level, or both of the filtered signal, and to transmit the adjusted filtered signal to the second quartz crystal resonator.

In an embodiment of the present invention, the driving circuit, the first buffer, the bandpass filter, and the waveform adjustment circuit are integrated into an integrated circuit (IC). The IC and the first quartz crystal resonator are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

In an embodiment of the present invention, the driving circuit, the first buffer, the bandpass filter, the waveform adjustment circuit, and the second buffer are integrated into an integrated circuit (IC). The IC and the first quartz crystal resonator are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

In an embodiment of the present invention, the driving circuit and the first buffer are integrated into a first integrated circuit (IC). The first IC and the first quartz crystal resonator are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

In an embodiment of the present invention, the bandpass filter and the waveform adjustment circuit are integrated into a second integrated circuit (IC).

In an embodiment of the present invention, the bandpass filter, the waveform adjustment circuit, and the second buffer are integrated into a second integrated circuit (IC).

In an embodiment of the present invention, the driving circuit, the first buffer, and the bandpass filter are integrated into an integrated circuit (IC). The IC and the first quartz crystal resonator are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

In an embodiment of the present invention, the bandpass filter is configured to adjust the passband and the central frequency equal to the harmonic frequency.

To sum up, the oscillating device generates high harmonic frequency with reduced phase noise with the bandpass filter and the second quartz crystal resonator.

DETAILED DESCRIPTION OF THE INVENTION

Figure 1:
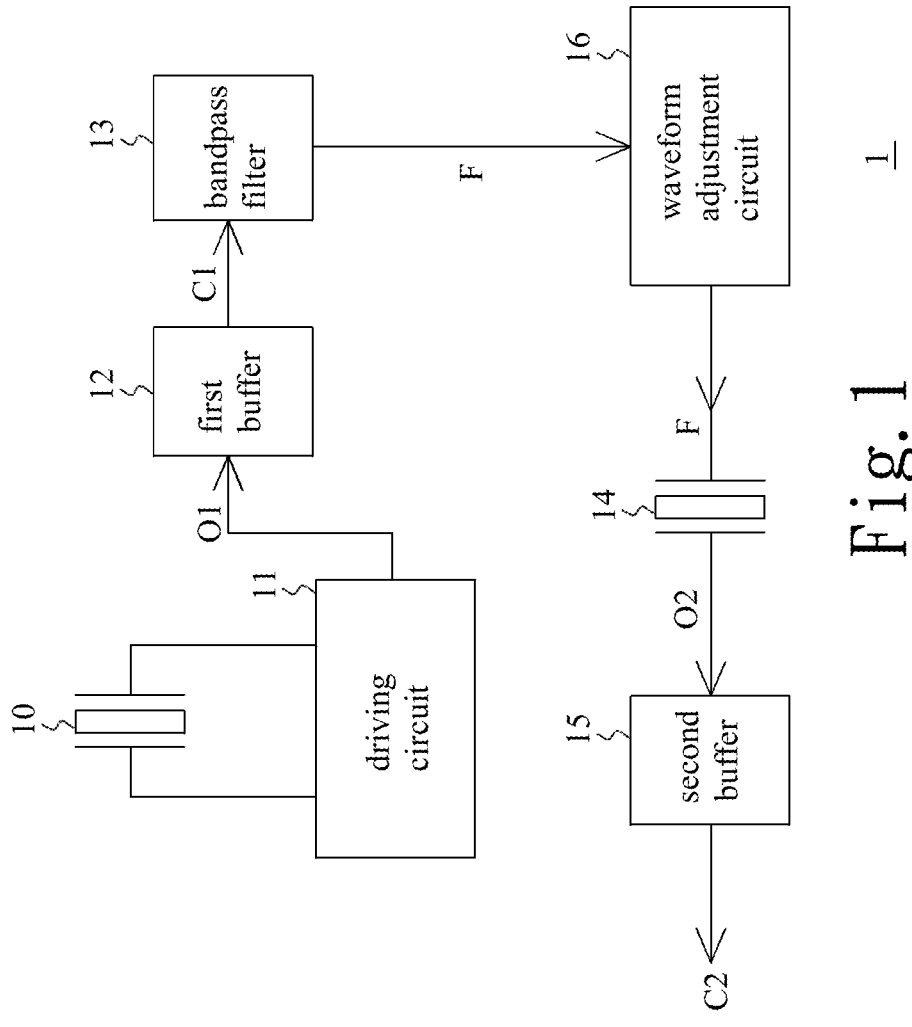
FIG. 1 is a diagram schematically illustrating an oscillating device according to a first embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/ without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

In the following description, an oscillating device will be provided. The oscillating device generates high harmonic frequency with reduced phase noise with a bandpass filter and a second quartz crystal resonator.

Figure 2:
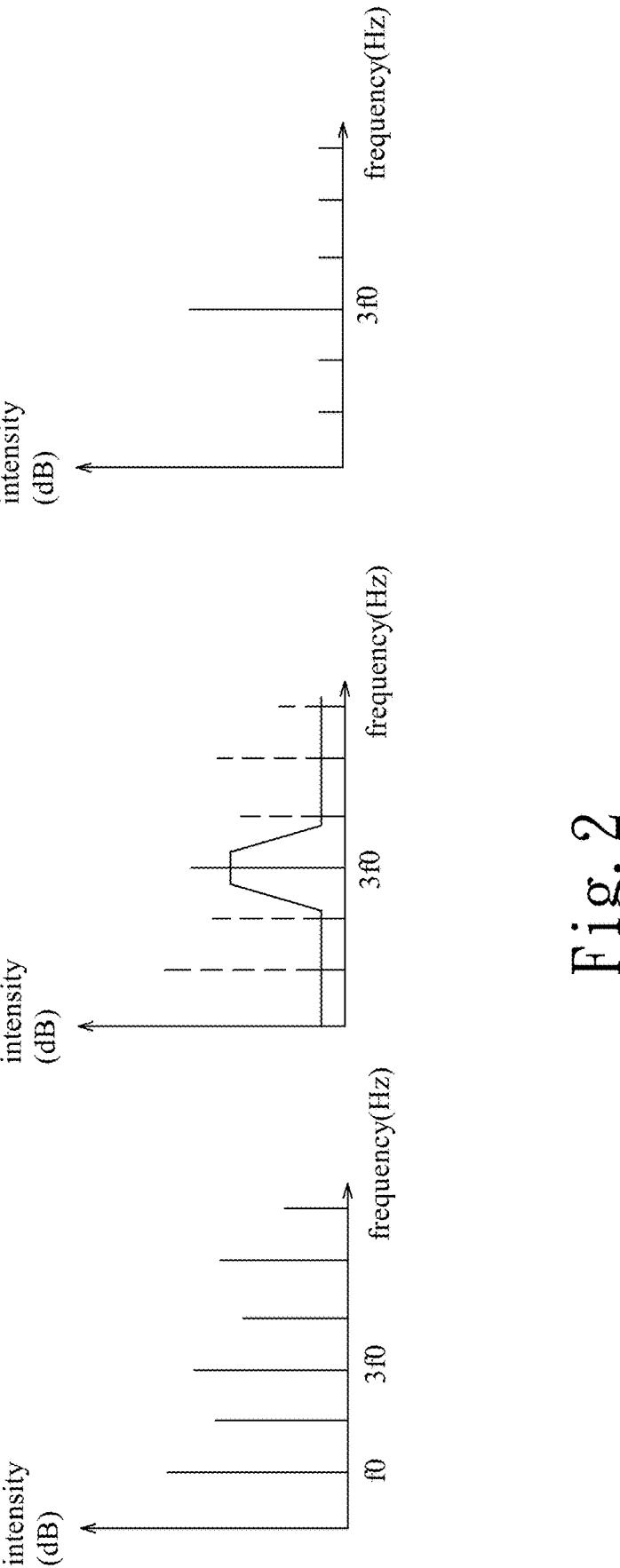
FIG. 2 is a diagram schematically illustrating the frequency spectrums of a filter signal according to an embodiment of the present invention.

FIG. 1 is a diagram schematically illustrating an oscillating device according to a first embodiment of the present invention. FIG. 2 is a diagram schematically illustrating the frequency spectrums of a filtered signal according to an embodiment of the present invention. Referring to FIG. 1 and FIG. 2, the oscillating device 1 includes a first quartz crystal resonator 10, a driving circuit 11, a first buffer 12, a bandpass filter 13, a second quartz crystal resonator 14, and a second buffer 15. The driving circuit 11 is coupled to the first quartz crystal resonator 10. The first buffer 12 is coupled to the driving circuit 11. The bandpass filter 13 is coupled to the first buffer 12. The second quartz crystal resonator 14 is coupled to the bandpass filter 13. The second buffer 15 is coupled to the second quartz crystal resonator 14. The first quartz crystal resonator 10 has a resonant frequency. The driving circuit 11 drives the first quartz crystal resonator 10 to generate a first oscillating signal O1 with the resonant frequency. The first buffer 12 receives the first oscillating signal O1 and isolates from a load variation behind the first quartz crystal resonator 10 and the driving circuit 11 to generate a first clock signal C1 in response to the first oscillating signal O1. The bandpass filter 13 has a passband and a center frequency. The bandpass filter 13 may be composed of adjustable capacitors and adjustable inductors. The bandpass filter 13 receives and allows only the first clock signal C1 with a harmonic frequency of the resonant frequency within the passband to pass through, thereby generating a filtered signal F. The bandpass filter 13 is configured to adjust the passband and the central frequency equal to the harmonic frequency. The harmonic frequency may be integer times of the resonant frequency, but the present invention is not limited thereto. For example, the harmonic frequency 3*f*0 is three times of the resonant frequency f0. The frequency spectrum of the first oscillating signal O1 is shown in the left inset of FIG. 2. The frequency spectrum with the passband of the bandpass filter 13 is shown in the middle inset of FIG. 2. The frequency spectrum of the filtered signal F is shown in the right inset of FIG. 2. The second quartz crystal resonator 14 has a frequency equal to the harmonic frequency and receives and rectifies the filtered signal F to generate a second oscillating signal O2 having the harmonic frequency. The second buffer 15 receives the second oscillating signal O2 and isolates from a load variation behind the first quartz crystal resonator 10, the driving circuit 11, the first buffer 12, the bandpass filter 13, and the second quartz crystal resonator 14 to generate a second clock signal C2 in response to the second oscillating signal O2. In some embodiments of the present invention, the oscillating device may further include a waveform adjustment circuit 16 coupled between the bandpass filter 13 and the second quartz crystal resonator 14. The waveform adjustment circuit 16 adjusts the waveform swing, the direct-current (DC) level, or both of the filtered signal F, but the present invention is not limited thereto. The waveform adjustment circuit 16 transmits the adjusted filtered signal F to the second quartz crystal resonator 14. For example, the waveform adjustment circuit 16 decreases the waveform swing, the DC level, or both of the filtered signal F to prevent from causing damage to the second quartz crystal resonator 14. The waveform adjustment circuit 16 increases the waveform swing, the DC level, or both of the filtered signal F to obviously reduce phase noise.

Figure 3:
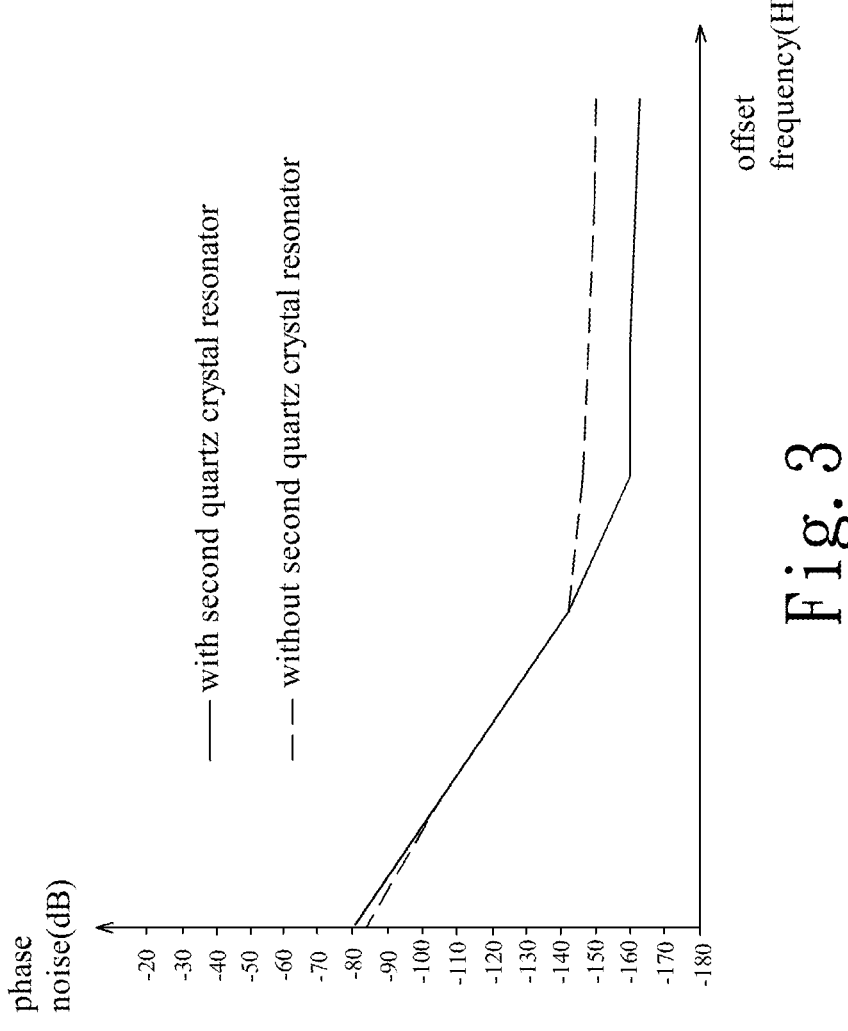
FIG. 3 is a diagram schematically illustrating curves of phase noise versus offset frequency with respect to carrier (resonant) frequency with and without a second quartz crystal resonator according to an embodiment of the present invention.

FIG. 3 is a diagram schematically illustrating curves of phase noise versus offset frequency with respect to carrier (resonant) frequency according to an embodiment of the present invention. Referring to FIG. 1 and FIG. 3, parameters in FIG. 1 and FIG. 3 are defined in equations (1) and (2).

$$|\Gamma| = \sqrt{\Gamma_x^2 + \Gamma_y^2 + \Gamma_z^2} \qquad (1)$$

$$\Gamma_i = \frac{2f_v \times 10^{\left(\frac{I_i(f_v)}{20}\right)}}{a_i \times v_o} \qquad (2)$$

i represents the position of the oscillating device 1. $\Gamma_i$ represents the acceleration sensitivity of i. $\Gamma_x$ represents the acceleration sensitivity of $\Gamma_i$ in the x direction. $\Gamma_y$ represents the acceleration sensitivity of $\Gamma_i$ in the y direction. $\Gamma_z$ represents the acceleration sensitivity of $\Gamma_i$ in the z direction. $f_v$ represents the output frequency of the oscillating device 1. $I_i(f_v)$ represents a power ratio at the output frequency. $a_i$ represents the acceleration of i. $v_o$ represents the frequency of the second oscillating signal O2. As illustrated in FIG. 1 and FIG. 3, the phase noise of the oscillating device 1 with the second quartz crystal resonator 14 is lower than the phase noise of the oscillating device without the second quartz crystal resonator. As a result, the oscillating device 1 configuration of dual filters including the bandpass filter 13 used to increase output frequency and the second quartz crystal resonator 14 used to reduce the phase noise.

Figure 4:
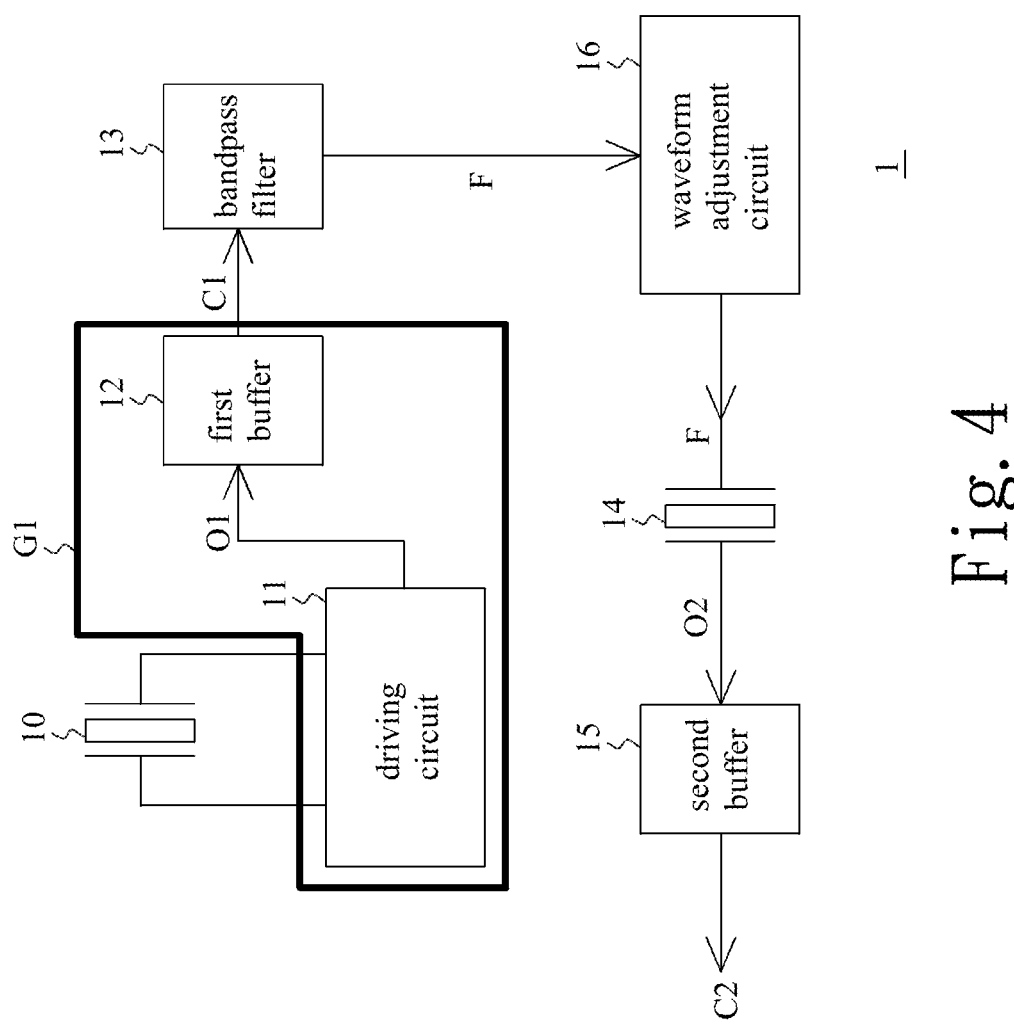
FIG. 4 is a diagram schematically illustrating an oscillating device according to a second embodiment of the present invention.

FIG. 4 is a diagram schematically illustrating an oscillating device according to a second embodiment of the present invention. Referring to FIG. 1 and FIG. 4, the driving circuit 11 and the first buffer 12 are integrated into a first integrated circuit (IC) G1. The first IC G1 and the first quartz crystal resonator 10 are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO), but the present invention is not limited thereto.

Figure 5:
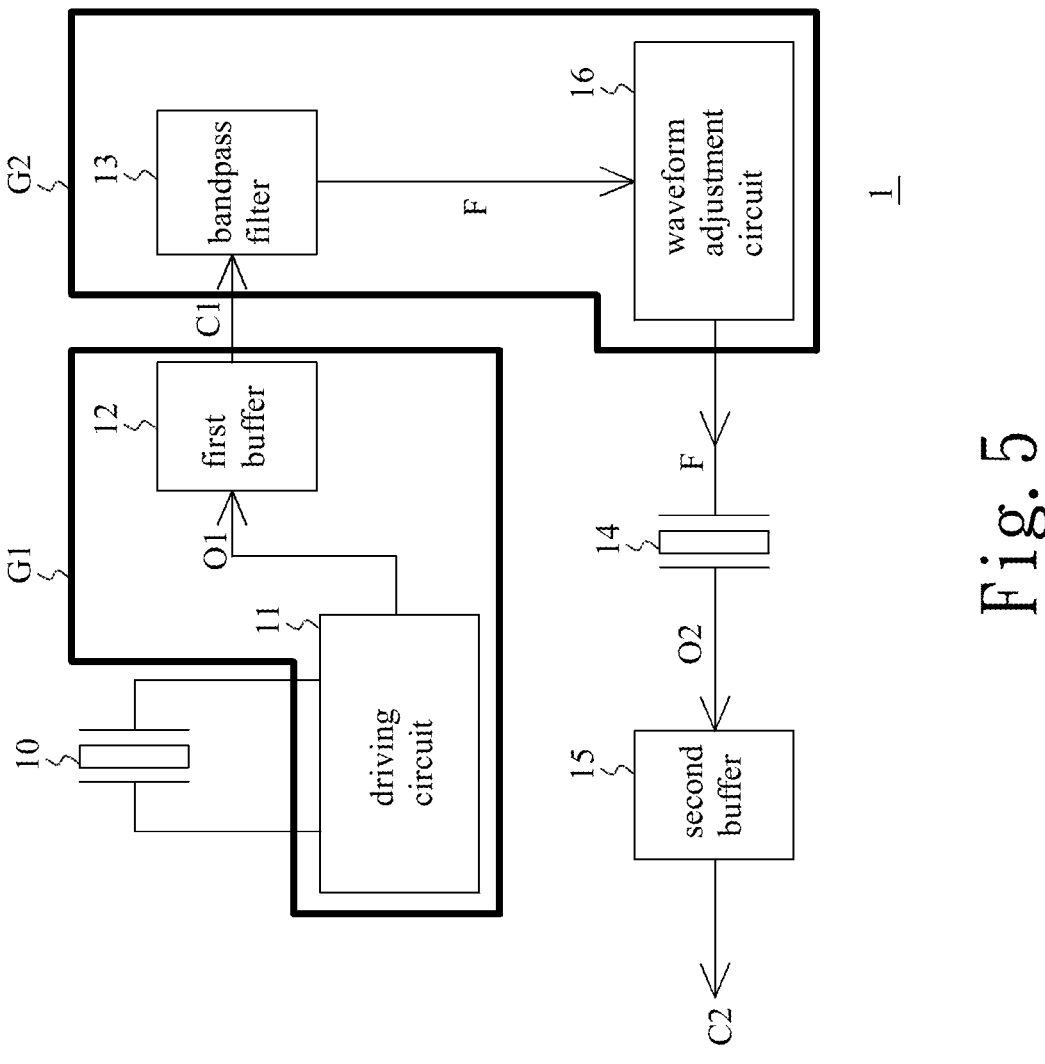
FIG. 5 is a diagram schematically illustrating an oscillating device according to a third embodiment of the present invention.

FIG. 5 is a diagram schematically illustrating an oscillating device according to a third embodiment of the present invention. Referring to FIG. 1 and FIG. 5, the driving circuit 11 and the first buffer 12 are integrated into a first integrated circuit (IC) G1. The first IC G1 and the first quartz crystal resonator 10 are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO), but the present invention is not limited thereto. The bandpass filter 13 and the waveform adjustment circuit 16 are integrated into a second integrated circuit (IC) G2.

Figure 6:
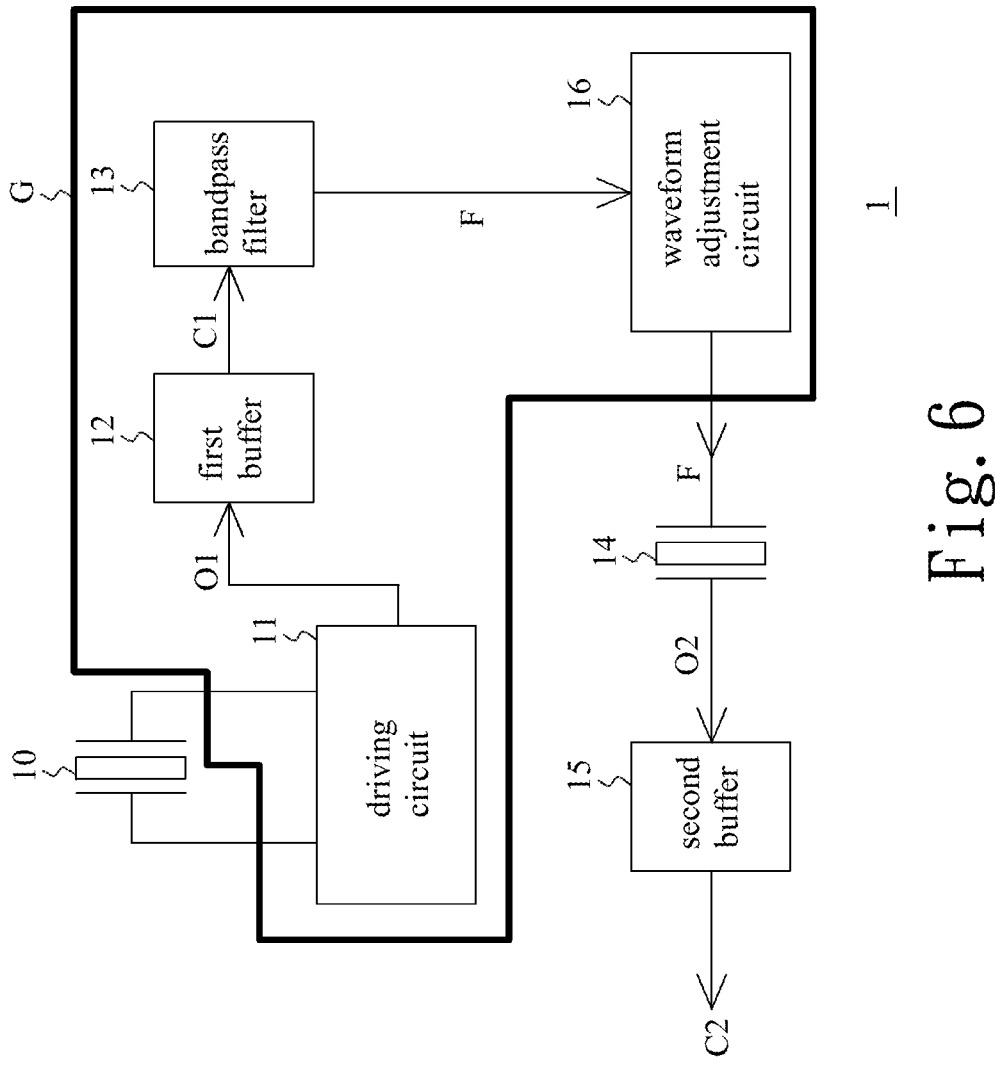
FIG. 6 is a diagram schematically illustrating an oscillating device according to a fourth embodiment of the present invention.

FIG. 6 is a diagram schematically illustrating an oscillating device according to a fourth embodiment of the present invention. Referring to FIG. 1 and FIG. 6, the driving circuit 11, the first buffer 12, the bandpass filter 13, and the waveform adjustment circuit 16 are integrated into an integrated circuit (IC) G. The IC G and the first quartz crystal resonator 10 are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO), but the present invention is not limited thereto.

Figure 7:
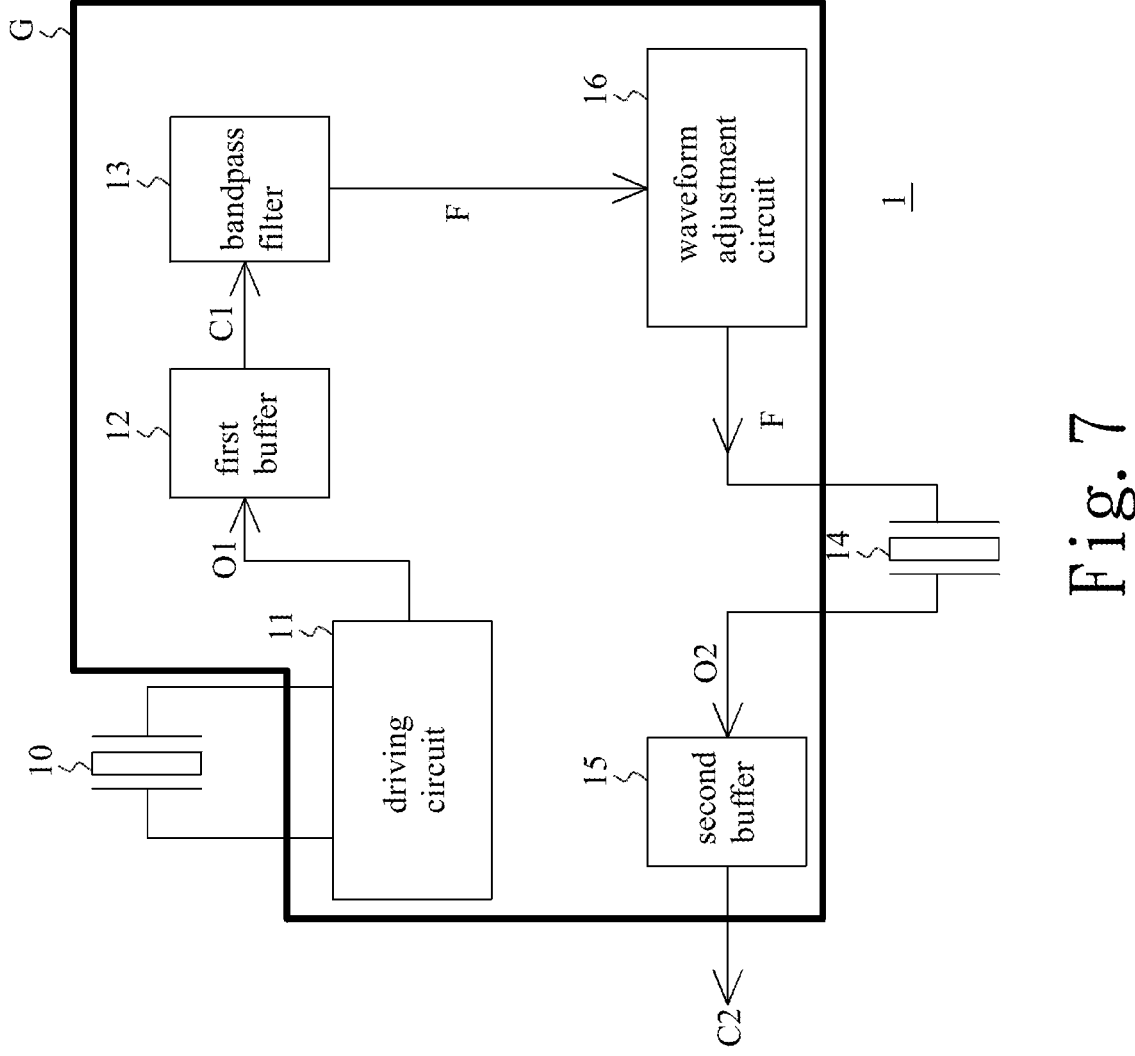
FIG. 7 is a diagram schematically illustrating an oscillating device according to a fifth embodiment of the present invention.

FIG. 7 is a diagram schematically illustrating an oscillating device according to a fifth embodiment of the present invention. Referring to FIG. 1 and FIG. 7, the driving circuit 11, the first buffer 12, the bandpass filter 13, the waveform adjustment circuit 16, and the second buffer 15 are integrated into an integrated circuit (IC) G. The IC G and the first quartz crystal resonator 10 are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO), but the present invention is not limited thereto.

Figure 8:
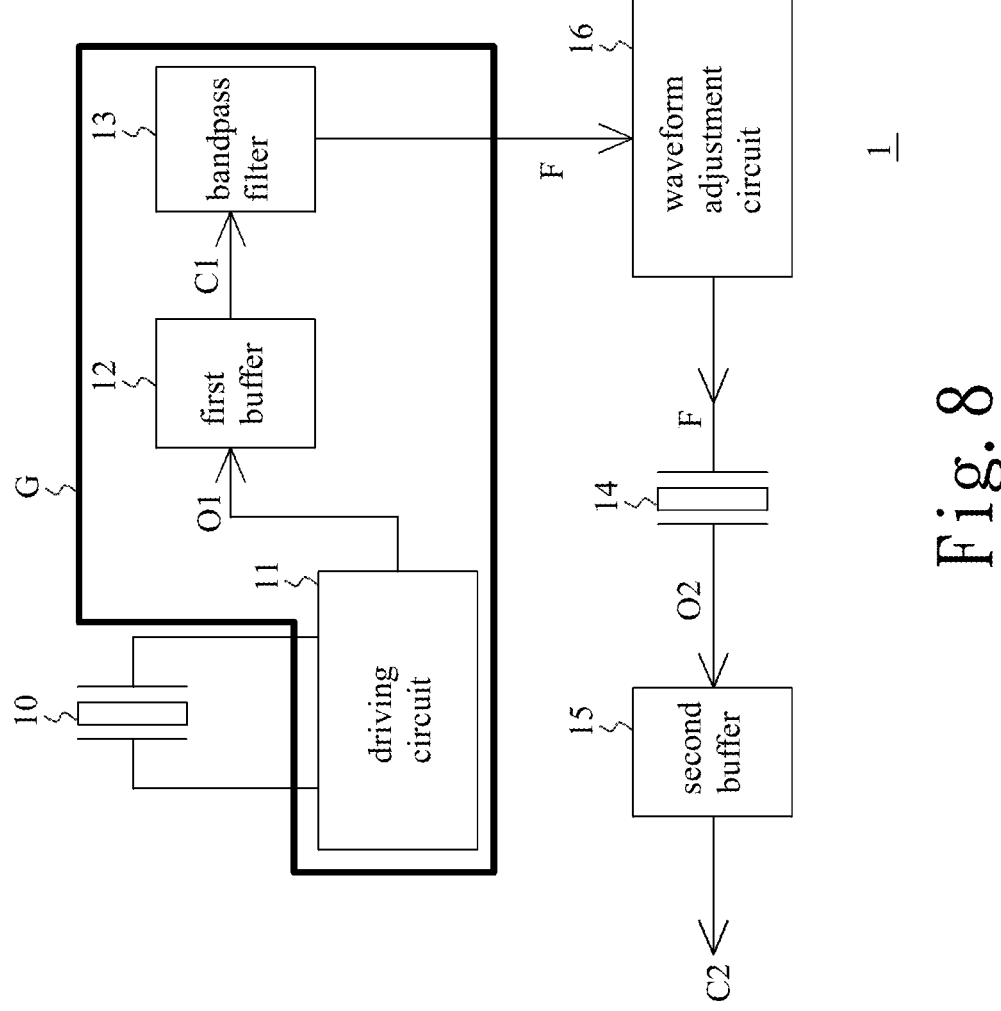
FIG. 8 is a diagram schematically illustrating an oscillating device according to a sixth embodiment of the present invention.

FIG. 8 is a diagram schematically illustrating an oscillating device according to a sixth embodiment of the present invention. Referring to FIG. 1 and FIG. 8, the driving circuit 11, the first buffer 12, and the bandpass filter 13 are integrated into an integrated circuit (IC) G. The IC G and the first quartz crystal resonator 10 are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO), but the present invention is not limited thereto.

Figure 9:
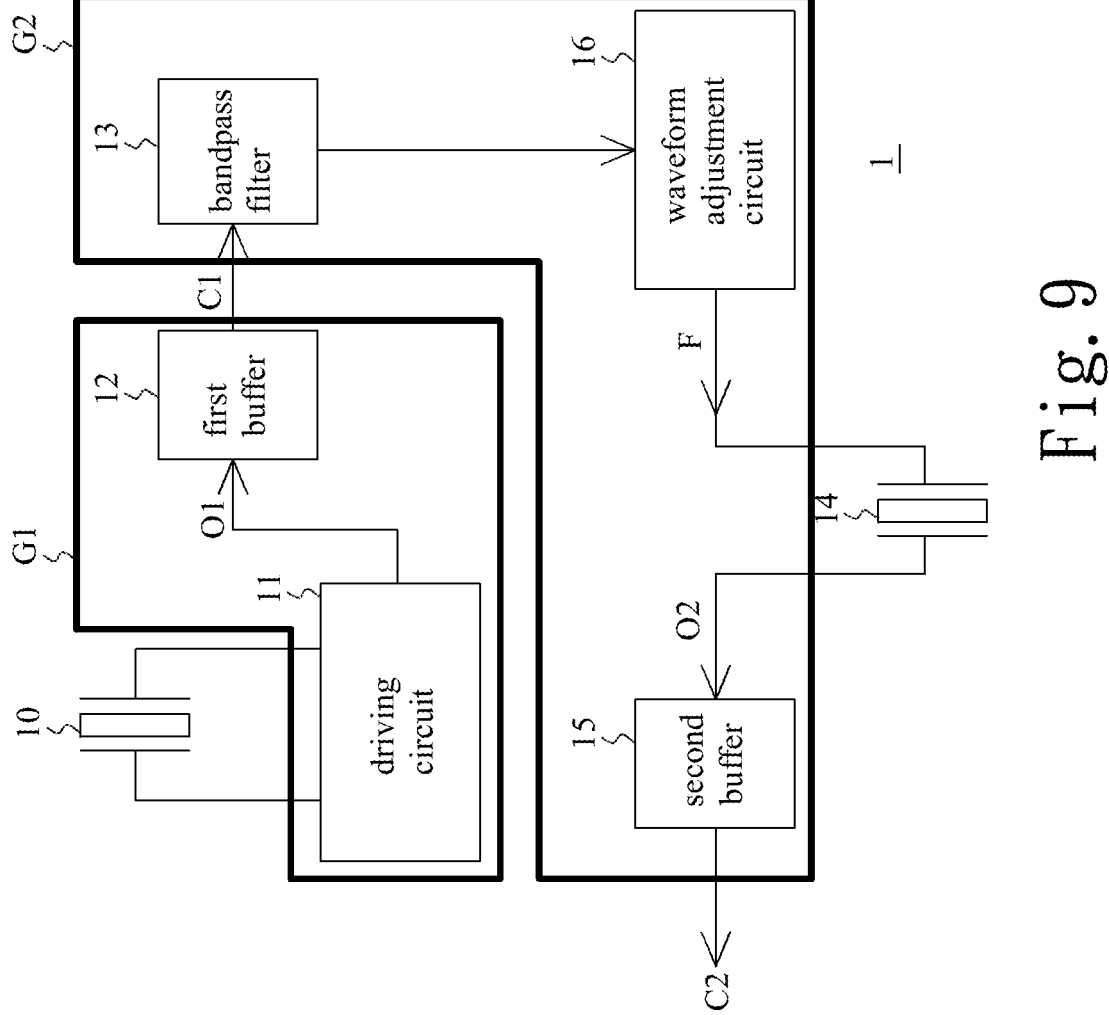
FIG. 9 is a diagram schematically illustrating an oscillating device according to a seventh embodiment of the present invention.

FIG. 9 is a diagram schematically illustrating an oscillating device according to a seventh embodiment of the present invention. Referring to FIG. 1 and FIG. 9, the driving circuit 11 and the first buffer 12 are integrated into a first integrated circuit (IC) G1. The first IC G1 and the first quartz crystal resonator 10 are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO), but the present invention is not limited thereto. The bandpass filter 13, the waveform adjustment circuit 16, and the second buffer 15 are integrated into a second integrated circuit (IC) G2.

According to the embodiments provided above, the oscillating device generates high harmonic frequency with reduced phase noise with the bandpass filter and the second quartz crystal resonator.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An oscillating device comprising:
a first quartz crystal resonator having a resonant frequency;
a driving circuit coupled to the first quartz crystal resonator and configured to drive the first quartz crystal resonator to generate a first oscillating signal with the resonant frequency;
a first buffer coupled to the driving circuit and configured to receive the first oscillating signal and isolate from a load variation behind the first quartz crystal resonator and the driving circuit to generate a first clock signal in response to the first oscillating signal;
a bandpass filter, coupled to the first buffer, having a passband, wherein the bandpass filter is configured to receive and allow only the first clock signal with a harmonic frequency of the resonant frequency within the passband to pass through, thereby generating a filtered signal;
a second quartz crystal resonator, having a frequency equal to the harmonic frequency, coupled to the bandpass filter and configured to receive the filtered signal to generate a second oscillating signal having the harmonic frequency; and
a second buffer coupled to the second quartz crystal resonator and configured to receive the second oscillating signal and isolate from a load variation behind the first quartz crystal resonator, the driving circuit, the first buffer, the bandpass filter, and the second quartz crystal resonator to generate a second clock signal in response to the second oscillating signal.

2. The oscillating device according to claim 1, further comprising a waveform adjustment circuit coupled between the bandpass filter and the second quartz crystal resonator and configured to adjust a waveform swing, a direct-current (DC) level, or both of the filtered signal, and to transmit the adjusted filtered signal to the second quartz crystal resonator.

3. The oscillating device according to claim 2, wherein the driving circuit, the first buffer, the bandpass filter, and the waveform adjustment circuit are integrated into an integrated circuit (IC), and the IC and the first quartz crystal resonator are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

4. The oscillating device according to claim 2, wherein the driving circuit, the first buffer, the bandpass filter, the waveform adjustment circuit, and the second buffer are integrated into an integrated circuit (IC), and the IC and the first quartz crystal resonator are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

5. The oscillating device according to claim 2, wherein the driving circuit and the first buffer are integrated into a first integrated circuit (IC), and the first IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

6. The oscillating device according to claim 5, wherein the bandpass filter and the waveform adjustment circuit are integrated into a second integrated circuit (IC).

7. The oscillating device according to claim 5, wherein the bandpass filter, the waveform adjustment circuit, and the second buffer are integrated into a second integrated circuit (IC).

8. The oscillating device according to claim 2, wherein the driving circuit, the first buffer, and the bandpass filter are integrated into an integrated circuit (IC), and the IC and the first quartz crystal resonator are coupled into a Crystal Oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

9. The oscillating device according to claim 1, wherein the bandpass filter is configured to adjust the passband and a central frequency equal to the harmonic frequency.

* * * * *